United States Patent
Na et al.

(10) Patent No.: US 11,205,374 B2
(45) Date of Patent: Dec. 21, 2021

(54) EMISSION CONTROL DRIVER STAGE AND DISPLAY DEVICE INCLUDING THE SAME

(71) Applicant: Samsung Display Co., LTD., Yongin-si (KR)

(72) Inventors: Ji Su Na, Yongin-si (KR); Yang Wan Kim, Yongin-si (KR); Joong Soo Moon, Yongin-si (KR); Young Jin Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/893,371

(22) Filed: Jun. 4, 2020

(65) Prior Publication Data

US 2020/0394952 A1    Dec. 17, 2020

(30) Foreign Application Priority Data

Jun. 11, 2019    (KR) .......................... 10-2019-0068932

(51) Int. Cl.
*G09G 3/32*    (2016.01)

(52) U.S. Cl.
CPC ....... *G09G 3/32* (2013.01); *G09G 2310/0202* (2013.01); *G09G 2310/0278* (2013.01)

(58) Field of Classification Search
CPC ............. G09G 3/32; G09G 2310/0202; G09G 2310/0278; G09G 3/3266; G09G 2310/0286; G09G 3/3258; G09G 2310/0262; G09G 2300/0426; G09G 2330/028; G09G 3/3233; G11C 19/28
See application file for complete search history.

(56) References Cited

U.S. PATENT DOCUMENTS

| | | | |
|---|---|---|---|
| 9,548,026 B2 | 1/2017 | Jang | |
| 10,311,781 B2 | 6/2019 | Lee et al. | |
| 10,388,228 B2 | 8/2019 | Kim et al. | |
| 10,431,162 B2 * | 10/2019 | Kim | H01L 27/1214 |

FOREIGN PATENT DOCUMENTS

| | | |
|---|---|---|
| KR | 10-2014-0025149 | 3/2014 |
| KR | 10-2017-0131758 | 11/2017 |
| KR | 10-2017-0143052 | 12/2017 |

* cited by examiner

*Primary Examiner* — Rodney Amadiz
(74) *Attorney, Agent, or Firm* — H.C. Park & Associates, PLC

(57) ABSTRACT

A stage in an emission control driver of a display device includes an input unit to control a voltage of a first node and a second node in response to a first input signal supplied from a first input terminal and a second input signal supplied from a second input terminal, respectively; a first controller to control a voltage of a third node and a fourth node in response to a third input signal supplied from a third input terminal and the voltage of the second node; a second controller to control the voltage of the fourth node in response to the voltage of the first node; and an output unit to supply a voltage of a first power supply or a second power supply to an output terminal in response to the voltage of the third node or the voltage of the fourth node. The first controller includes a first transistor and a second transistor connected between the first power supply and the third node; and a third transistor connected between the first node and the third node, the first transistor being turned on in response to the voltage of the second power supply.

20 Claims, 9 Drawing Sheets

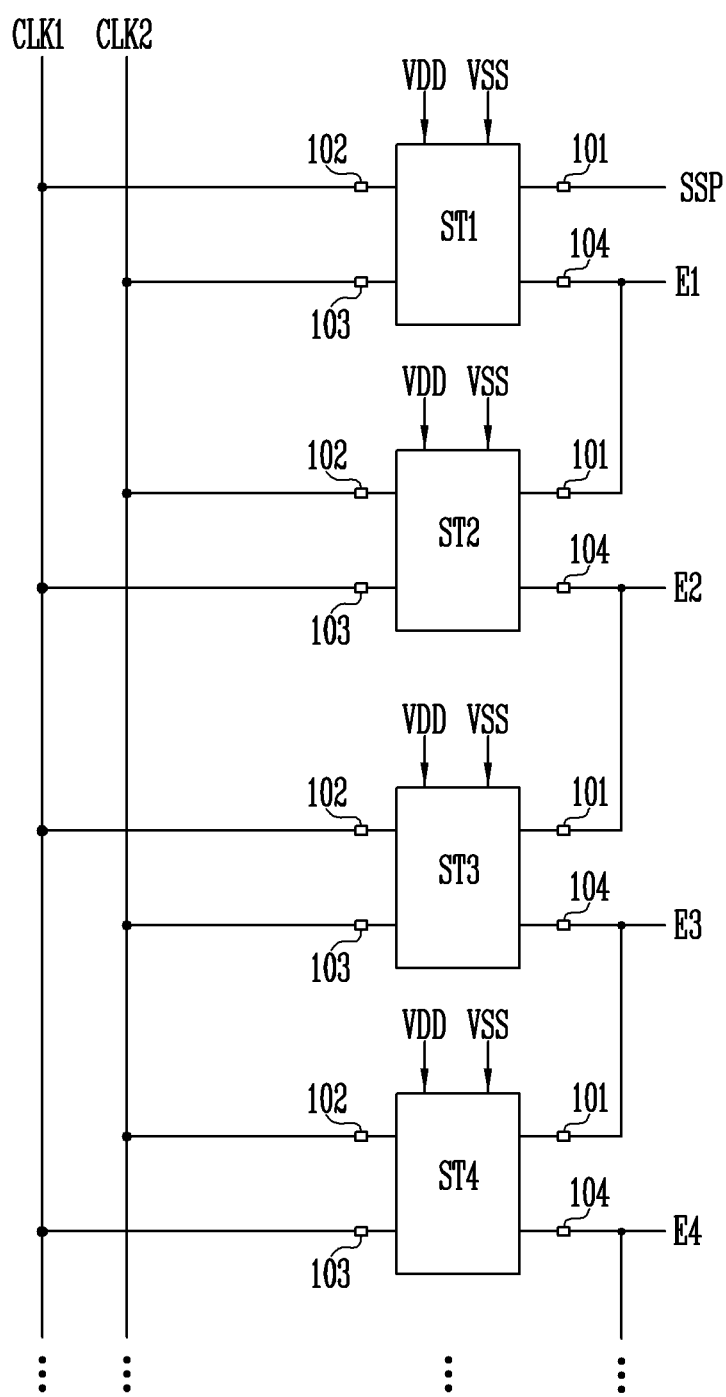

EMISSION CONTROL DRIVER STAGE AND DISPLAY DEVICE INCLUDING THE SAME

CROSS-REFERENCE TO RELATED APPLICATION

This application claims priority from and the benefit of Korean Patent Application No. 10-2019-0068932 filed on Jun. 11, 2019, which is hereby incorporated by reference for all purposes as if fully set forth herein.

BACKGROUND

Field

Exemplary implementations of the invention relate generally to an emission control driver for a display device and, and more particularly to an emission control driver having stages to supply emission control signals to pixels and a display device including the same.

Discussion of the Background

A display device displays an image using pixels disposed in a display unit. The pixels are connected to scan lines and data lines, and are driven by scan signals and data signals supplied through the scan lines and data lines.

The pixels may be further connected to emission control lines, and an emission period of the pixels may be controlled using emission control signals supplied to the emission control lines. In this case, the display device may include an emission control driver for generating the emission control signal.

The emission control driver includes stages for supplying each of the emission control signals to each of the emission control lines. The stages output a gate-on voltage to the emission control line connected to the corresponding pixels during an emission period of the pixels disposed in each horizontal line, and output the emission control signal of a gate-off voltage to the emission control line during the other periods, thereby blocking an emission of the pixels.

The above information disclosed in this Background section is only for understanding of the background of the inventive concepts, and, therefore, it may contain information that does not constitute prior art.

SUMMARY

Applicant discovered that internal voltages (e.g., node voltages) in the stages of emission control drivers in display devices may be unstable at a beginning of the driving of the display device, which may make it difficult to control the emission of pixels as desired.

Emission control driver stages and display devices incorporating the same constructed according to the principles and exemplary implementations of the invention are capable of stably controlling an emission of pixels even at an initial stage of driving a display device.

For example, emission control driver stages constructed according to exemplary embodiments of the invention prevent the electrical characteristics of the transistors connected to the first and second nodes included in the stage from being changed and stably supply the emission control signal of the gate-off voltage to the emission control lines even at an initial stage of driving the display device, such that the output quality of the emission control driver is improved and unintended flashing due to the emission of pixels may be reduced or eliminated.

Additional features of the inventive concepts will be set forth in the description which follows, and in part will be apparent from the description, or may be learned by practice of the inventive concepts.

According to one aspect of the invention, a stage in an emission control driver of a display device includes: an input unit to control a voltage of a first node and a second node in response to a first input signal supplied from a first input terminal and a second input signal supplied from a second input terminal, respectively; a first controller to control a voltage of a third node and a fourth node in response to a third input signal supplied to a third input terminal and the voltage of the second node; a second controller to control the voltage of the fourth node in response to the voltage of the first node; and an output unit to supply a voltage of a first power supply or a second power supply to an output terminal in response to the voltage of the third node or the voltage of the fourth node. The first controller includes a first transistor and a second transistor connected between the first power supply and the third node; and a third transistor connected between the first node and the third node, the first transistor being turned on in response to the voltage of the second power supply.

The second transistor may have one electrode connected directly to the third node without passing through the third transistor.

The first transistor may have a gate electrode connected to the second node, and the second transistor may have a gate electrode connected to the third input terminal.

The first controller further may include a first capacitor connected between the third node and the third input terminal.

The voltage of the first power supply may be set to a gate-off voltage, and the voltage of the second power supply may be set to a gate-on voltage.

The output unit may include a fourth transistor connected between the first power supply and the output terminal, the fourth transistor having a gate electrode connected to the fourth node; and a fifth transistor connected between the output terminal and the second power supply, the fifth transistor having a gate electrode connected to the third node.

The first input signal may be a start pulse or an output signal of a previous stage, and the second input signal and the third input signal may be a first clock signal and a second clock signal, respectively.

The first clock signal and the second clock signal may alternately have a gate-on voltage. The start pulse or the output signal of the previous stage may be supplied to overlap with at least one gate-on voltage period of the first clock signal.

The input unit may include the sixth transistor connected between the first input terminal and the first node, the sixth transistor having a gate electrode connected to the second input terminal; a seventh transistor connected between the second node and the second input terminal, the seventh transistor having a gate electrode connected to the first node; and an eighth transistor connected between the second node and the second power supply, the eighth transistor having a gate electrode connected to the second input terminal.

The first controller may further include a ninth transistor connected between the second node and a fifth node, the ninth transistor being turned on in response to a voltage of the second power supply; a second capacitor connected between the fifth node and a sixth node; a tenth transistor connected between the fourth node and the sixth node, the tenth transistor having gate electrode connected to the third input terminal; and an eleventh transistor connected between the sixth node and the third input terminal, the tenth transistor having a gate electrode connected to the fifth node.

The second controller may include a twelfth transistor connected between the first power supply and the fourth node, the twelfth transistor having a gate electrode connected to the first node or the third node; and a third capacitor connected between the first power supply and the fourth node.

According to another aspect of the invention, a display device includes: a plurality of pixels connected to a plurality of scan lines, a plurality of data lines, and a plurality of emission control lines; a scan driver to supply scan signals to the scan lines; a data driver to supply data signals to the data lines; and an emission control driver having a plurality of stages to supply emission control signals to the emission control lines. Each of the stages includes an input unit to control a voltage of a first node and a second node in response to a first input signal supplied from a first input terminal and a second input signal supplied from the second input terminal, respectively; a first controller to control a voltage of a third node and a fourth node in response to a third input signal supplied to a third input terminal and the voltage of the second node, and including a first transistor and a second transistor connected between the first power supply and the third node and a third transistor connected between the first node and the third node, the third transistor being turned on in response to the voltage of the second power supply; a second controller to control a voltage of the fourth node in response to a voltage of the first node; and an output unit to supply a voltage of the first power supply or the second power supply to an output terminal in response to a voltage of the third node or the voltage of the fourth node.

The second transistor may have one electrode connected directly to the third node without passing through the third transistor.

The first transistor may have a gate electrode connected to the second node, and the second transistor may have a gate electrode connected to the third input terminal.

The first controller may further include a first capacitor connected between the third input terminal and the third node.

The voltage of the first power supply may be set to a gate-off voltage, and the voltage of the second power supply may be set to a gate-on voltage.

The output unit may include a fourth transistor connected between the first power supply and the output terminal, the fourth transistor having a gate electrode connected to the fourth node; and a fifth transistor connected between the output terminal and the second power supply, the fourth transistor having a gate electrode connected to the third node.

The stages may include a first stage to receive a start pulse through the first input terminal and the other stages to receive an output signal of a previous stage through the first input terminal.

The stage may include odd numbered stages to receive a first clock signal through the second input terminal and a second clock signal through the third input terminal, respectively, and even numbered stages to receive the second clock signal through the second input terminal and the first clock signal through the third input terminal, respectively.

The first clock signal and the second clock signal may alternately have a gate-on voltage.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 3 is a block diagram of an exemplary embodiment of an emission control driver constructed according to the principles of the invention.

DETAILED DESCRIPTION

Figure 1:
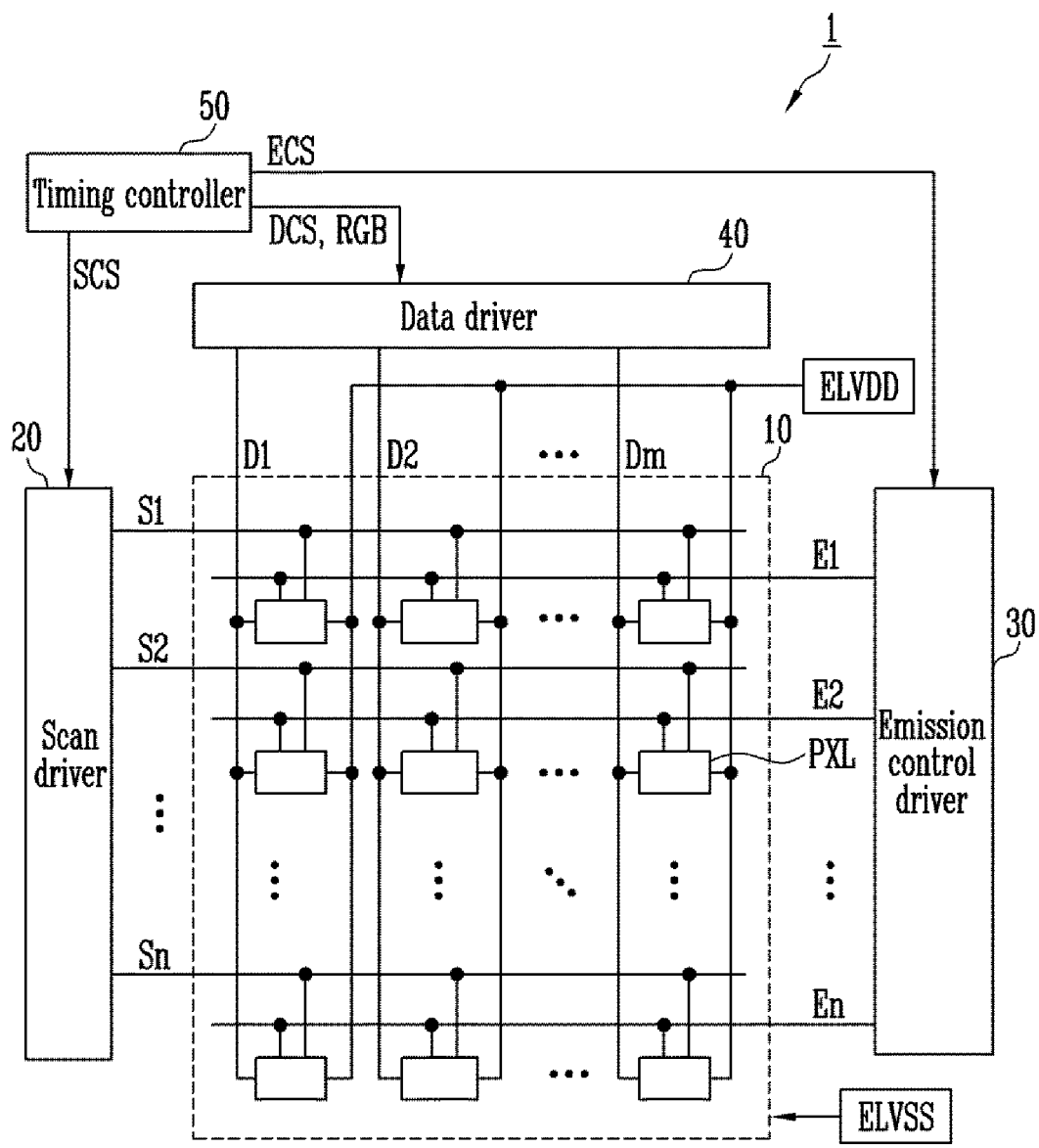
FIG. 1 is a block diagram of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a block diagram of an exemplary embodiment of a display device constructed according to the principles of the invention. FIG. 1 illustrates a light emitting display device having light emitting elements as an exemplary embodiment of the display device 1, but the display device 1 is not limited thereto.

Referring to FIG. 1, display device 1 includes a display unit 10, a scan driver 20 for driving the display unit 10, an emission control driver 30, a data driver 40, and a timing controller 50.

The display unit 10 includes pixels PXL that are connected to scan lines S1 to Sn, emission control lines E1 to En, and data lines D1 to Dm. In an exemplary embodiment, the term "connection" may include both electrical and/or physical connections. For example, the pixels PXL may be electrically connected to the scan lines S1 to Sn, the emission control lines E1 to En, and the data lines D1 to Dm.

The pixels PXL receive scan signals, emission control signals, and data signals from the scan lines S1 to Sn, the emission control lines E1 to En, and the data lines D1 to Dm, respectively. In addition, the pixels PXL further receive a driving power supply such as a first pixel power supply ELVDD and a second pixel power supply ELVSS.

The pixels PXL receive each of the data signals from the data lines D1 to Dm when each of the scan signals is supplied from the scan lines S1 to Sn, and emit light with a luminance corresponding to the data signal. Accordingly, an image corresponding to the data signal of each frame is displayed in the display unit 10.

Each pixel PXL may include a light emitting element and a pixel circuit for driving the light emitting element. The pixel circuit controls a driving current that is conducted from the first pixel power supply ELVDD to the second pixel power supply ELVSS via the light emitting element corresponding to the data signal.

The scan driver 20 receives a scan driving control signal SCS from the timing controller 50 and supplies the scan signal to the scan lines S1 to Sn in response to the scan driving control signal SCS. For example, the scan driver 20 may supply a scan signal to the scan lines S1 to Sn sequentially. When a scan signal is supplied to the scan lines S1 to Sn, pixels PXL are selected in horizontal line unit in response to each scan signal.

The scan signal may be used to select the pixels PXL in the horizontal line unit. For example, the scan signal may have a gate-on voltage (e.g., low voltage) at which transistors of each pixel PXL connected to the data lines D1 to Dm may be turned on, and may be supplied to the pixels PXL disposed on the corresponding horizontal line for each horizontal period.

The pixels PXL receiving the scan signal may be connected to the data lines D1 to Dm while the scan signal is supplied and may receive each data signal. That is, the scan signal may be supplied to transfer the data signal to the pixels PXL.

The emission control driver 30 receives an emission driving control signal ECS from the timing controller 50 and supplies an emission control signal to the emission control lines E1 to En in response to the emission driving control signal ECS. For example, the emission control driver 30 may supply the emission control signal to the emission control lines E1 to En sequentially.

The emission control signal may be used to control an emission period (e.g., emission time point and/or emission duration) of the pixels PXL in the horizontal line unit. For example, the emission control signal may have a gate-off voltage (e.g., high voltage) at which at least one transistor disposed on the current path of each pixel PXL may be turned off. In this case, the pixel PXL receiving the emission control signal may be set to a non-emission state during a period in which the emission control signal is supplied, and may be set to an emission state during the other period. On the other hand, when a data signal corresponding to a black grayscale is supplied to a specific pixel PXL, the pixel PXL may maintain a non-emission state in response to a data signal even if an emission control signal is not supplied.

The data driver 40 receives a data driving control signal DCS and image data RGB from the timing controller 50 and supplies a data signal the data lines D1 to Dm in response to the data driving control signal DCS and the image data RGB. The data signal supplied to the data lines D1 to Dm are supplied to the pixels PXL selected by the scan signal. For this purpose, the data driver 40 may supply a data signal to the data lines D1 to Dm to synchronize with each scan signal. For example, the data driver 40 may output a data signal corresponding to the pixels PXL of the corresponding horizontal line to the data lines D1 to Dm to synchronize with each scan signal for each horizontal period.

The timing controller 50 receives various control signals (e.g., vertical/horizontal synchronization signal, main clock signal, etc.) from an external (e.g., host processor) and generates the scan driving control signal SCS, the emission driving control signal ECS, and the data driving control signal DCS in response to the control signals. The scan driving control signal SCS, the emission driving control signal ECS, and the data driving control signal DCS are supplied to the scan driver 20, the emission control driver 30, and the data driver 40, respectively.

The scan driving control signal SCS includes a start pulse and clock signals. The start pulse controls an output timing of a first scan signal (e.g., the scan signal supplied to a first scan line S1), and the clock signals are used to shift the start pulse.

The emission driving control signal ECS includes a start pulse and clock signals. The start pulse controls an output timing of a first emission control signal (e.g., the emission control signal supplied to a first emission control line E1), and the clock signals are used to shift the start pulse.

The data driving control signal DCS includes a source start pulse and clock signals. The source start pulse controls a sampling starting point of the data, and the clock signals are used to control a sampling operation.

In addition, the timing controller 50 receives input image data from the external and rearranges the input image data to generate image data RGB. The timing controller 50 supplies the image data RGB to the data driver 40.

Figure 2A:
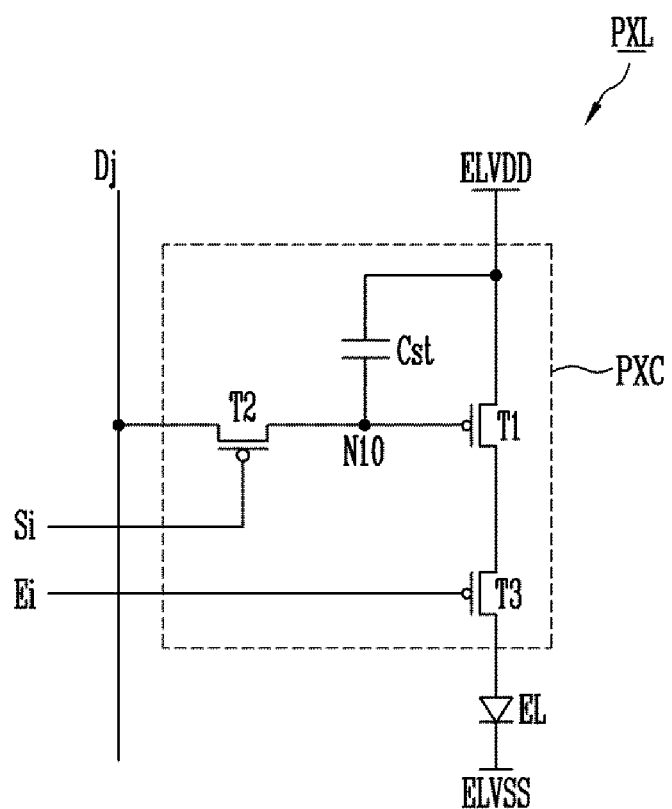
FIGS. 2A and 2B are circuit diagrams of representative pixels of the display device of FIG. 1.
Figure 2B:
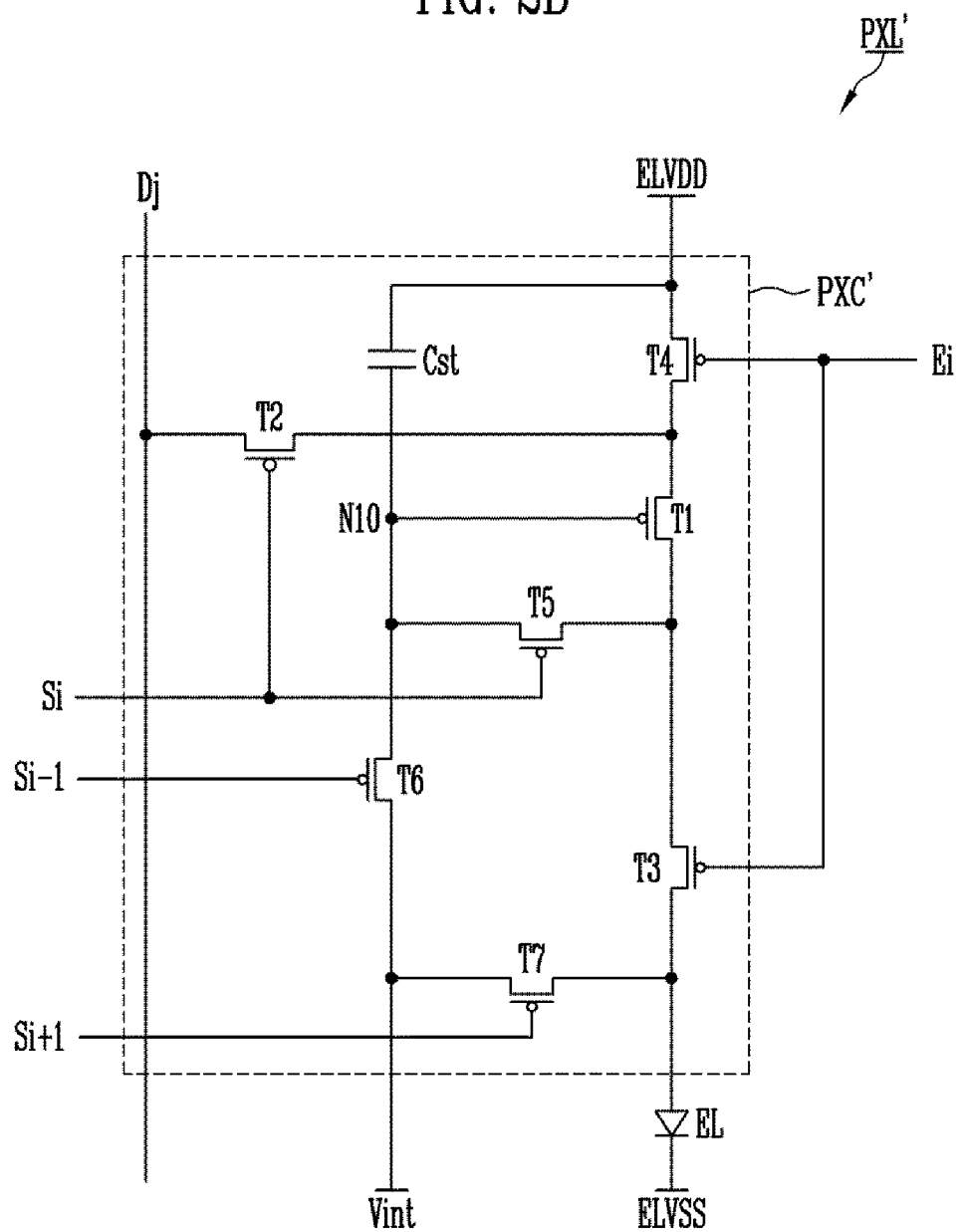

FIGS. 2A and 2B are circuit diagrams of representative pixels of the display device of FIG. 1. For example, FIGS. 2A and 2B show different exemplary embodiments of a pixel PXL that may be disposed in the display unit 10 of FIG. 1. The pixel PXL and PXL' may be disposed in an i-th (i is a natural number) horizontal line and a j-th (j is a natural number) vertical line of the display unit 10 to be connected to an i-th scan line Si, an i-th emission control line Ei, and a j-th data line Dj. According to an exemplary embodiment, the pixels PXL or PXL' disposed in the display unit 10 of FIG. 1 may have substantially the same structure as each other. Hereinafter, "the i-th scan line Si", "the i-th emission control line Ei" and "the j-th data line Dj" are referred to as "a scan line Si", "an emission control line Ei", and "a data line Dj", respectively.

Referring to FIG. 2A, the pixel PXL according to an exemplary embodiment includes a light emitting element EL and a pixel circuit PXC for driving the light emitting element EL. According to an exemplary embodiment, the light emitting element EL may be connected between the pixel circuit PXC and the second pixel power supply ELVSS, but the position of the light emitting element EL is not limited thereto. For example, in another exemplary embodiment, the light emitting element EL may be connected between the first pixel power supply ELVDD and the pixel circuit PXC.

The light emitting element EL is connected between the first pixel power supply ELVDD and the second pixel power supply ELVSS in a forward direction. For example, an anode of the light emitting element EL may be connected to the first pixel power supply ELVDD via the pixel circuit PXC and a cathode of the light emitting element EL may be connected to the second pixel power supply ELVSS. The first pixel power supply ELVDD and the second pixel power supply ELVSS may have a potential difference that allows the light emitting element EL to emit light. For example, the first pixel power supply ELVDD may be a high potential pixel power supply, and the second pixel power supply ELVSS may be a low potential pixel power supply having a potential lower than the first pixel power supply ELVDD by the threshold voltage or more of the light emitting element EL.

The pixel circuit PXC includes a first transistor T1, a second transistor T2, a third transistor T3, and a storage capacitor Cst.

The first transistor T1 is connected between the first pixel power supply ELVDD and the light emitting element EL. For example, a first electrode (e.g., source electrode) of the first transistor T1 may be connected to the first pixel power supply ELVDD, and a second electrode (e.g., drain electrode) of the first transistor T1 may be connected to the anode of a light emitting element EL via the third transistor T3. Then, a gate electrode of the first transistor T1 is connected to a tenth node N10. The first transistor T1 controls the driving current from the first pixel power supply ELVDD to the second pixel power supply ELVSS via the third transistor T3 and the light emitting element EL in response to a voltage of the tenth node N10.

The second transistor T2 is connected between the data line Dj and the tenth node N10. For example, a first electrode (e.g., source electrode) of the second transistor T2 may be connected to the data line Dj, and a second electrode (e.g., drain electrode) of the second transistor T2 may be connected to the tenth node N10. A gate electrode of the second transistor T2 is connected to the scan line Si. The second transistor T2 is turned on when the scan signal (e.g., scan signal of a low voltage) is supplied to the scan line Si to transfer the data signal from the data line Dj to the tenth node N10.

The third transistor T3 is connected between the first transistor T1 and the light emitting element EL. For example, a first electrode (e.g., source electrode) of the third transistor T3 may be connected to a second electrode of the first transistor T1, and a second electrode (e.g., drain electrode) of the third transistor T3 may be connected to the anode of the light emitting element EL. A gate electrode of the third transistor T3 is connected to the emission control line Ei. The third transistor T3 is turned off when the emission control signal (e.g., emission control signal of a high voltage) is supplied to the emission control line Ei, and is turned on in other case (e.g., a case where the supply of the emission control signal is stopped and a voltage of the emission control line Ei is maintained at a gate-on voltage).

When the third transistor T3 is turned off, a connection between the first transistor T1 and the light emitting element EL is cut off so that a current path is blocked in the pixel PXL and the pixel PXL does not emit light. When the third transistor T3 is turned on, the first transistor T1 and the light emitting element EL are electrically connected to each other so that a current path through which a driving current flows may be formed in the pixel PXL and the pixel PXL may emit light.

The storage capacitor Cst is connected between the first pixel power supply ELVDD and the tenth node N10. The storage capacitor Cst charges a voltage corresponding to a voltage of the tenth node N10.

The structure of the pixel PXL may be variously changed according to a particular exemplary embodiment. For example, the structure of the pixel circuit PXC may be changed to another exemplary embodiment shown in FIG. 2B.

Referring to FIG. 2B, the pixel PXL' includes a light emitting element EL and a pixel circuit PXC' for driving the light emitting element EL. The pixel circuit PXC' includes first to seventh transistors T1 to T7 and a storage capacitor Cst.

An anode of the light emitting element EL is connected to a first transistor T1 via a third transistor T3, and a cathode of the light emitting element EL is connected to a second pixel power supply ELVSS. When a driving current is supplied from the first transistor T1, the light emitting element EL generates light of a luminance corresponding to a current amount of the driving current.

A first electrode of the first transistor T1 is connected to a first pixel power supply ELVDD via a fourth transistor T4, and a second electrode of the first transistor T1 is connected to the anode of the light emitting element EL via the third transistor T3. Then, a gate electrode of the first transistor T1 may be connected to a tenth node N10. The first transistor T1 controls a driving current flowing from the first pixel power supply ELVDD to the second pixel power supply ELVSS via the light emitting element EL in response to a voltage of the tenth node N10.

The second transistor T2 is connected between a data line Dj and the first electrode of the first transistor T1. A gate electrode of the second transistor T2 is connected to a scan line Si. The second transistor T2 is turned on when a scan signal is supplied to the scan line Si and connects the data line Dj to the first electrode of the first transistor T1. Thus, when the second transistor T2 is turned on, a data signal from the data line Dj may be transferred to the first electrode of the first transistor T1. On the other hand, during a period when the second transistor T2 is turned on by the scan signal, the first transistor T1 is turned on in a diode-connected manner by a fifth transistor T5. Thus, the data signal from the data line Dj may be transferred to the tenth node N10 via the second transistor T2, the first transistor T1 and the fifth transistor T5. Then, the storage capacitor Cst charges a voltage corresponding to the data signal and a threshold voltage of the first transistor T1.

The third transistor T3 is connected between the first transistor T1 and the light emitting element EL, and a gate electrode of the third transistor T3 is connected to an emission control line Ei. The third transistor T3 is turned off when an emission control signal is supplied to the emission control line Ei, and is turned on in other cases.

The fourth transistor T4 is connected between the first pixel power supply ELVDD and the first transistor T1. A gate electrode of the fourth transistor T4 is connected to the emission control line Ei. The fourth transistor T4 is turned off when the emission control signal is supplied to the emission control line Ei, and is turned on in other cases.

That is, the third and fourth transistors T3 and T4 may be simultaneously turned on or off by the emission control signal. When the third and fourth transistors T3 and T4 are turned on, a current path through which a driving current may flow is formed in the pixel PXL. Conversely, when the third and fourth transistors T3 and T4 are turned off, the current path is blocked and the pixel PXL does not emit light.

The fifth transistor T5 is connected between the first transistor T1 and the tenth node N10. A gate electrode of the fifth transistor T5 is connected to the scan line Si. The fifth transistor T5 is turned on when the scan signal is supplied to the scan line Si, thereby connecting a second electrode of the first transistor T1 to the tenth node N10. Thus, when the fifth transistor T5 is turned on, the first transistor T1 is connected in a diode form.

The sixth transistor T6 is connected between the tenth node N10 and an initialization power supply Vint. A gate electrode of the sixth transistor T6 is connected to the previous scan line, for example, an i−1-th scan line Si−1. The sixth transistor T6 is turned on when the scan signal is supplied to the i−1-th scan line Si−1 to initialize a voltage of the tenth node N10 with a voltage of the initialization power supply Vint.

In an exemplary embodiment, the i−1-th scan line Si−1 is used as the initialization control line for initializing the gate node, that is, the tenth node N10 of the first transistor T1, but the exemplary embodiments are not limited thereto. For example, in another exemplary embodiment, another control line, such as the i−2-th scan line Si−2, may be used as the initialization control line for initializing the gate node of the first transistor T1.

The voltage of the initialization power supply Vint may be set to a lower voltage than the voltage of the data signal. That is, the voltage of the initialization power supply Vint may be set to be equal to or less than the lowest voltage of the data signal. Therefore, when the voltage of the tenth node N10 charged by the data signal of the previous frame is initialized to the lowest voltage or less of the data signal before the data signal of a current frame is transferred to each pixel PXL, the first transistor T1 is diode-connected in the forward direction during a period in which the scan signal supplied to the scan line Si regardless of the data signal of the previous frame. Accordingly, the data signal of the current frame may be stably transferred to the tenth node N10.

A seventh transistor T7 is connected between the initialization power supply Vint and the anode of the light emitting element EL. A gate electrode of the seventh transistor T7 is connected to an i+1-th scan line Si+1. The seventh transistor T7 is turned on when the scan signal is supplied to the i+1-th scan line Si+1 to initialize a voltage of the anode of the light emitting element EL to the voltage of the initial power supply Vint. Thus, the pixel PXL may present a uniform luminance characteristic.

In an exemplary embodiment, a case where an initialization control line of the anode connected to the gate electrode of the seventh transistor T7 is the i+1-th scan line Si+1 is described as an example, but the exemplary embodiments are not limited thereto. For example, in another exemplary embodiment, the gate electrode of the seventh transistor T7 may be connected to a current scan line, that is, a scan line Si (or another control line). In this case, when the scan signal is supplied to the scan line Si, the voltage of the anode of the light emitting element EL may be initialized to the voltage of the initialization power supply Vint.

The storage capacitor Cst is connected between the first pixel power supply ELVDD and the tenth node N10. The storage capacitor Cst charges a voltage corresponding to the data signal and the threshold voltage of the first transistor T1.

On the other hand, the structure of pixel PXL and PXL' is not limited to exemplary embodiments shown in FIGS. 2A and 2B. For example, the pixel circuit PXC and PXC' may have various structures currently known.

FIG. 3 is a block diagram of an exemplary embodiment of an emission control driver constructed according to the principles of the invention. For convenience of description, FIG. 3 shows only four stages ST, for example, first to fourth stages ST1 to ST4. According to an exemplary embodiment, the emission control driver 30 may include a plurality of stages ST dependently connected to an input terminal of a start pulse SSP (e.g., first input terminal 101 of a first stage ST1), such as the first to fourth stages ST1 to ST4.

Referring to FIG. 3, the emission control driver 30 according to an exemplary embodiment includes a plurality of stages ST for supplying a plurality of emission control signals to a plurality of emission control lines E, respectively. The stages ST are connected to at least one of the emission control lines E1 to E4, and are driven in response to at least one clock signal CLK (e.g., first clock signal CLK1 and second clock signal CLK2). For example, the first to fourth stages ST1 to ST4 are connected to the first to fourth emission control lines E1 to E4, respectively, and generate emission control signals using the first and second clock signals CLK1 and CLK2. The first to fourth stages ST1 to ST4 may output the emission control signals to the first to fourth emission control lines E1 to E4, sequentially. According to an exemplary embodiment, the stages ST may have substantially the same circuit structure.

Each of the stages ST includes a first input terminal 101, a second input terminal 102, a third input terminal 103, and an output terminal 104.

The first input terminal 101 receives a first input signal. According to an exemplary embodiment, the first input signal may be a start pulse SSP or an output signal of the previous stage (i.e., emission control signal of the previous stage). For example, the first stage (hereinafter, referred to as "first stage ST1") may receive the start pulse SSP through the first input terminal 101, and the other stages ST may receive the output signal of the previous stage through the first input terminals 101.

A second input terminal 102 and a third input terminal 103 receive a second input signal and a third input signal, respectively. According to an exemplary embodiment, the second input signal and the third input signal of the k-th (k is an odd-number or even-number) stage STk may be the first clock signal CLK1 and the second clock signal CLK2, respectively. The second input signal and the third input signal of the k+1-th stage STk+1 may be the second clock signal CLK2 and the first clock signal CLK1, respectively. For example, the k-th stage STk receives the first clock signal CLK1 and the second clock signal CLK2 through the second input terminal 102 and the third input terminal 103, respectively, and the k+1-th stage STk+1 receive the second clock signal CLK2 and the first clock signal CLK1 through the second input terminal 102 and the third input terminal 103, respectively.

The first clock signal CLK1 and the second clock signal CLK2 may alternately have a gate-on voltage. For example, the first clock signal CLK1 and the second clock signal CLK2 may be signals that have the same cycle and do not overlap with each other in phase. For example, the second clock signal CLK2 may be a clock signal that is obtained by shifting the first clock signal CLK1 by half a cycle.

In addition, the stages ST operate with the first power supply VDD and the second power supply VSS. A voltage of the first power supply VDD may be set to a gate-off voltage (e.g., high voltage) and a voltage of the second power supply VSS may be set to a gate-on voltage (e.g., low voltage). In this case, the voltage of the first power supply VDD transferred to the output terminal 104 may be used as an emission control signal for preventing emission of the pixels PXL.

Figure 4:
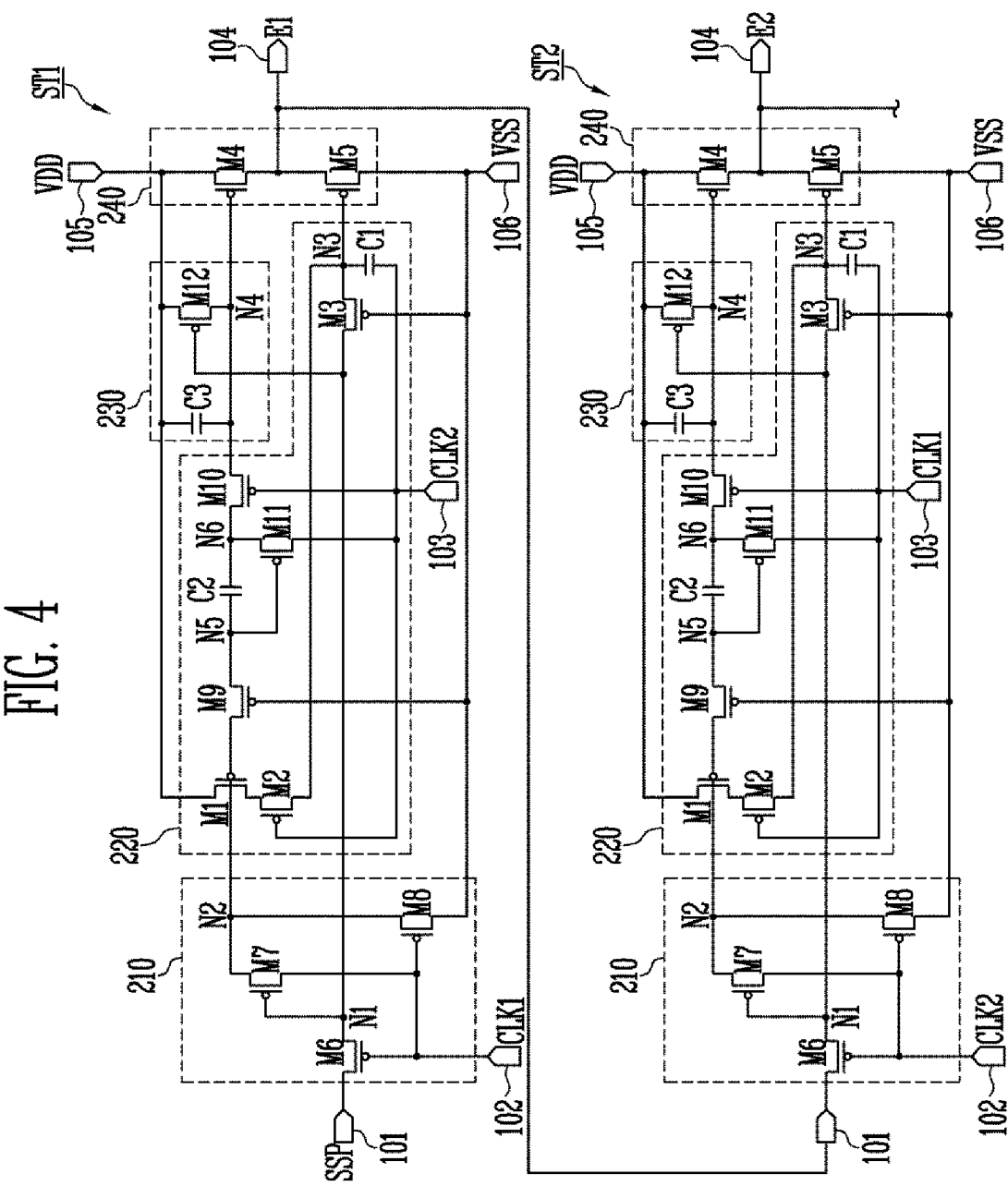
FIG. 4 is a circuit diagram of a first exemplary embodiment of two stages shown in FIG. 3.

FIG. 4 is a circuit diagram of a first exemplary embodiment of two stages shown in FIG. 3. According to an exemplary embodiment, a plurality of stages ST forming the emission control driver 30 may have substantially the same circuit structure. Therefore, FIG. 4 shows only the first stage ST1 and the second stage ST2 as a representative of the stages ST.

Referring to FIG. 4, the stage ST according to an exemplary embodiment includes an input unit 210, a first controller 220, a second controller 230, and an output unit 240. The stage ST generates an emission control signal using the first to third input signals supplied through the first to third input terminals 101 to 103, respectively, and supplies the generated emission control signal to the output terminal 104. For example, the stage ST may output each emission control signal by using the start pulse or the output signal of the previous stage, one of the first and second clock signals CLK1 and CLK2, and the other of the first and second clock signals CLK1 and CLK2, supplied through the first to third input terminals 101 to 103.

In addition, the stage ST is connected to the first and second power supplies VDD and VSS through first and second power terminals 105 and 106, respectively. The stage ST may control the voltage of the output terminal 104 by using voltages of the first and second power supplies VDD and VSS supplied to the first and second power terminals 105 and 106. Hereinafter, the circuit structure of each stage ST will be described focusing on the first stage ST1 for convenience of description.

The input unit 210 controls voltages of the first node N1 and the second node N2 in response to the first input signal supplied from the first input terminal 101 and the second input signal supplied from the second input terminal 102. For example, the input unit 210 may control the voltages of the first node N1 and the second node N2 in response to the start pulse SSP supplied from the first input terminal 101 and the first clock signal CLK1 supplied from the second input terminal 102. For this purpose, the input unit 210 includes sixth to eighth transistors M6 to M8.

The sixth transistor M6 is connected between the first input terminal 101 and the first node N1. Then, a gate electrode of the sixth transistor M6 is connected to the second input terminal 102. The sixth transistor M6 is turned on when the first clock signal CLK1 of a gate-on voltage (e.g., low voltage) is supplied to the second input terminal 102 to connect the first input terminal 101 to the first node N1.

The seventh transistor M7 is connected between the second node N2 and the second input terminal 102. Then, a gate electrode of the seventh transistor M7 is connected to the first node N1. The seventh transistor M7 is turned on or off in response to the voltage of the first node N1.

The eighth transistor M8 is connected between the second node N2 and the second power supply VSS. Then, a gate electrode of the eighth transistor M8 is connected to the second input terminal 102. The eighth transistor M8 is turned on when the first clock signal CLK1 of a gate-on voltage is supplied from the second input terminal 102, and supplies a voltage of the second power supply VSS to the second node N2.

The first controller 220 controls voltages of the third node N3 and the fourth node N4 in response to voltages of the third input signal (e.g., second clock signal CLK2) and the second node N2 supplied from the third input terminal 103. For this purpose, the first controller 220 includes first to third transistors M1 to M3, ninth to eleventh transistors M9 to M11, and first and second capacitors C1 and C2.

The first and second transistors M1 and M2 are connected to the first power supply VDD and the third node N3. For example, the first and second transistors M1 and M2 may be connected in series between the first power supply VDD and the third node N3.

Gate electrodes of the first and second transistors M1 and M2 are connected to different nodes. Thus, the first and second transistors M1 and M2 are turned on or off in response to a voltage applied to each gate node. For example, the gate electrode of the first transistor M1 may be connected to the second node N2, and the gate electrode of the second transistor M2 may be connected to the third input terminal 103.

The first transistor M1 is turned on or off in response to the voltage of the second node N2. For example, the first transistor M1 is turned on when a gate-on voltage is supplied to the second node N2 to connect the first power supply VDD to the second transistor M2.

The second transistor M2 is turned on or off in response to a voltage of the third input signal supplied to the third input terminal 103. For example, the second transistor M2 is turned on when the second clock signal CLK2 of a gate-on voltage is supplied to the third input terminal 103 to connect the first transistor M1 to the third node N3.

The first and second transistors M1 and M2 may be turned on together during a period in which a gate-on voltage is supplied to both the second node N2 and the third input terminal 103. When the first and second transistors M1 and M2 are turned on together, the voltage of the first power supply VDD is transferred to the third node N3. Then, the fifth transistor M5 is turned off by the voltage of the first power supply VDD.

In an exemplary embodiment, the second transistor M2 is directly connected to the third node N3 without passing through other circuit elements. For example, one electrode (e.g., drain electrode) of the second transistor M2 is directly connected to the third node N3 without passing through the third transistor M3 and the like. Accordingly, at a beginning of the driving of the display device 1 (for example, time point at which a driving power supply (e.g., first power supply VDD and second power supply VSS) and driving signals (e.g., start pulse SSP, first clock signal CLK1, and the second clock signal CLK2) start to be supplied to the stages ST), the voltage of the first power supply VDD may be quickly transferred to the third node N3. Thus, the fifth transistor M5 may be stably maintained in the turn-off state at a beginning of the driving of the display device 1. Accordingly, it is possible to prevent the voltage of the second power supply VSS from being transferred to the emission control lines E before the emission period of the pixels PXL starts.

According to an exemplary embodiment, it is possible to prevent an abnormal emission of the pixels PXL due to instability of node voltages inside the stages ST at the beginning of the driving of the display device 1. For example, it is possible to prevent a flashing when the pixels PXL unintentionally emit light at the beginning of the driving of the display device 1 by directly connecting the first and second transistors M1 and M2 between the first power supply VDD and the third node N3.

The third transistor M3 is connected between the first node N1 and the third node N3. Then, the gate electrode of the third transistor M3 is connected to the second power supply VSS. The third transistor M3 is turned on in response to the voltage of the second power supply VSS during a period in which the second power supply VSS is supplied. For example, the first and second power supplies VDD and VSS may be continuously supplied to the emission control driver 30 during a period in which the display device 1 is driven, so that the third transistor M3 may continuously maintain a turn-on state during a period in which the emission control driver 30 is driven. For example, the third transistor M3 may always maintain a turn-on state during a period in which the stage ST is driven, so the third transistor M3 may also be called an always on transistor (AOT).

By connecting the third transistor M3 between the first and third nodes N1 and N3, the voltage drop width of the first node N1 may be limited. Thus, the voltage difference between the source and drain electrodes of the sixth transistor M6 may be limited. Accordingly, exemplary embodiments of the invention may prevent the characteristics of the sixth transistor M6 from changing, and enhance reliability of the sixth transistor M6.

The ninth transistor M9 is connected between the second node N2 and the fifth node N5. A gate electrode of the ninth transistor M9 is connected to the second power supply VSS. The ninth transistor M9 is turned on in response to the voltage of the second power supply VSS during a period in which the second power supply VSS is supplied. For example, the first and second power supplies VDD and VSS are continuously supplied to the emission control driver 30 during a period in which the display device 1 is driven, so that the ninth transistor M9 may continuously maintain a turn-on state during a period in which the emission control driver 30 is driven. For example, the ninth transistor M9 may always maintain a turn-on state during a period in which the stage ST is driven, so the ninth transistor M9 may also be called the AOT.

By connecting the ninth transistor M9 between the second and fifth nodes N2 and N5, the voltage drop width of the second node N2 may be limited. Thus, the voltage difference between the source and drain electrodes of the seventh transistor M7 and the voltage difference between the gate electrode and the source or drain electrode of the first transistor M1 may be limited. Accordingly, exemplary embodiments of the invention may prevent the characteristics of the first and seventh transistors M1 and M7 from changing, and enhance reliability of the first and seventh transistors M1 and M7.

The tenth transistor M10 is connected between the sixth node N6 and the fourth node N4, the sixth node N6 connected to one electrode of the second capacitor C2. Then, a gate electrode of the tenth transistor M10 is connected to the third input terminal 103. The tenth transistor M10 is turned on when the second clock signal CLK2 of a gate-on voltage is supplied from the third input terminal 103 to connect the sixth node N6 to the fourth node N4.

The eleventh transistor M11 is connected between the sixth node N6 and the third input terminal 103. Then, a gate electrode of the eleventh transistor M11 is connected to the fifth node N5. The eleventh transistor M11 is turned on or off in response to a voltage of the fifth node N5.

The first capacitor C1 is connected between the third node N3 and the third input terminal 103. The first capacitor C1 charges a voltage applied to the third node N3. In addition, the first capacitor C1 controls a voltage of the third node N3 in response to a voltage of the second clock signal CLK2 supplied from the third input terminal 103.

The second capacitor C2 is connected between the fifth node N5 and the sixth node N6. The second capacitor C2 controls a voltage of the fifth node N5 in response to a voltage of the second clock signal CLK2 when the second clock signal CLK2 is transferred to the sixth node N6.

The second controller 230 controls a voltage of the fourth node N4 in response to a voltage of the first node N1. For this purpose, the second controller 230 includes a twelfth transistor M12 and a third capacitor C3.

The twelfth transistor M12 is connected between the first power supply VDD and the fourth node N4. Then, a gate electrode of the twelfth transistor M12 is connected to the first node N1. The twelfth transistor M12 is turned on or off in response to a voltage of the first node N1. In another exemplary embodiment, a gate electrode of the twelfth transistor M12 may be directly connected to the third node N3. In this case, the twelfth transistor M12 is turned on or off in response to a voltage of the third node N3.

The third capacitor C3 is connected between the first power supply VDD and the fourth node N4. The third capacitor C3 charges a voltage applied to the fourth node N4. In addition, the third capacitor C3 keeps the voltage of the fourth node N4 stable.

The output unit 240 supplies the voltages of the first power supply VDD or the second power supply VSS to the output terminal 104 in response to the voltage of the third node N3 or the voltage of the fourth node N4. For this purpose, the output unit 240 includes a fourth transistor M4 and a fifth transistor M5.

The fourth transistor M4 is connected between the first power supply VDD and the output terminal 104. Then, a gate electrode of the fourth transistor M4 is connected to the fourth node N4. The fourth transistor M4 is turned on or off in response to a voltage of the fourth node N4. When the fourth transistor M4 is turned on, the voltage of the first power supply VDD is transferred to the output terminal 104, and the voltage of the first power supply VDD is used as an emission control signal for controlling an emission period of the pixels PXL (e.g., pixels PXL disposed in a first horizontal line of the display unit 10) connected to each of the emission control lines E (e.g., first emission control line E1). For example, the pixels PXL may be set to a non-emission state during a period in which the emission control signal corresponding to the voltage of the first power supply VDD is supplied.

The fifth transistor M5 is connected between the output terminal 104 and the second power supply VSS. Then, a gate electrode of the fifth transistor M5 is connected to the third node N3. The fifth transistor M5 is turned on or off in response to the voltage of the third node N3. When the fifth transistor M5 is turned on, the voltage of the second power supply VSS is transferred to the output terminal 104, so that the pixels PXL may be set to an emission state.

The first to third input signals supplied to the first to third input terminals 101 to 103 in the second stage ST2 are different from those in the first stage ST1, but the circuit structure and operation of the second stage ST2 may be substantially the same as those of the first stage ST1. For example, the second stage ST2 may receive the output signal of the first stage ST1 (first emission control signal supplied to the first emission control line E1), the second clock signal CLK2, and the first clock signal CLK1 through the first to third input terminals 101 to 103, respectively and may generate an emission control signal by using the output signal of the first stage ST1, the second clock signal CLK2, and the first clock signal CLK1. The emission control signal generated in the second stage ST2 is supplied to a second emission control line E2.

The stages ST may sequentially output the emission control signals to each of the emission control lines E using a method described above. The circuit structure and operation of each of the second stage ST2 and next stages ST may be substantially the same as the first stage ST1. Therefore, a detailed description thereof will be omitted to avoid redundancy.

Figure 5:
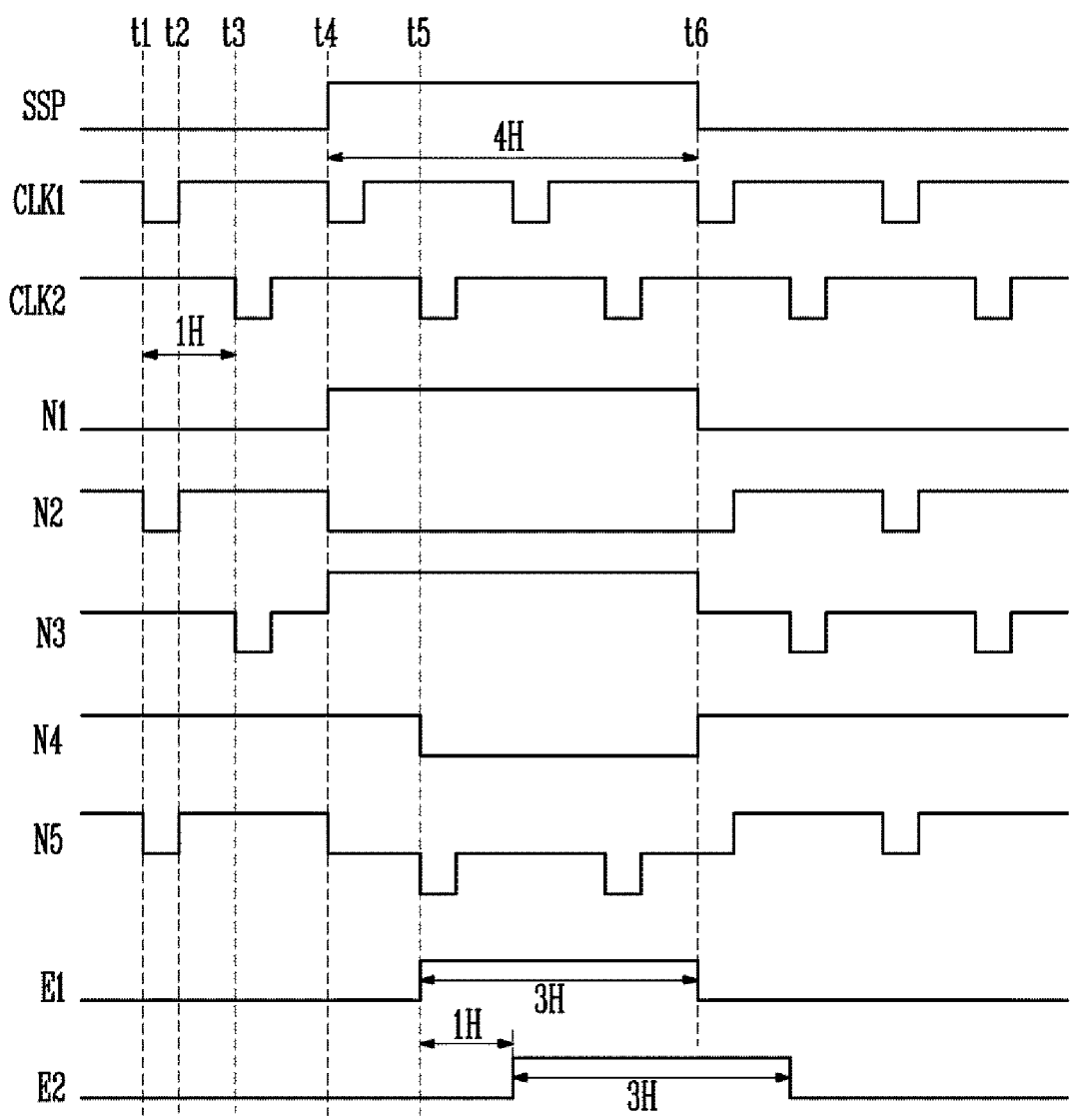
FIG. 5 is an exemplary timing diagram illustrating an example of a driving method of the stages shown in FIG. 4.

FIG. 5 is an exemplary timing diagram illustrating an example of a driving method of the stages shown in FIG. 4. For convenience of description, FIG. 5 shows the operation process of the first stage ST1, and the other stages ST2, ST3, and ST4 may also be operated in substantially the same method.

Referring to FIG. 5, the first clock signal CLK1 and the second clock signal CLK2 are supplied to have a gate-on voltage at different time points. For example, each of the first clock signal CLK1 and the second clock signal CLK2 may have a cycle of two horizontal periods 2H, and may be supplied to have a gate-on voltage in different horizontal periods. For example, the second clock signal CLK2 may be a signal that is obtained by shifting the first clock signal CLK1 by half a cycle (i.e., one horizontal period 1H).

The start pulse SSP supplied to the first input terminal 101 of the first stage ST1 may overlap with at least one gate-on voltage period of the first clock signal CLK1 supplied to the second input terminal 102 of the first stage ST1. Similarly, the output signal of the previous stage supplied to the first input terminal 101 of the other stages ST CLK2 may overlap with at least one gate-on voltage period the first clock signal CLK1 or the second clock signal CLK2 supplied to the second input terminal 102.

For this purpose, the start pulse SSP may have a width greater than the first clock signal CLK1, for example, a width corresponding to four horizontal periods 4H. In this case, the first emission control signal supplied to the first input terminal 101 of the second stage ST2 may also overlap with at least one gate-on voltage of the second clock signal CLK2 supplied to the second input terminal 102 of the second stage ST2. For example, the first emission control signal supplied to the first input terminal 101 of the second stage ST2 may have a width corresponding to three horizontal periods 3H.

When the start pulse SSP (or output signal of the previous stage) is supplied, a gate-off voltage (e.g., high voltage of the first power supply VDD) may be supplied to the first input terminal 101. When the start pulse SSP is not supplied, a gate-on voltage (e.g., low voltage of the second power supply VSS) may be supplied to the first input terminal 101.

The operation of the first stage ST1 will be described below with referring to FIGS. 4 and 5. First, the first clock signal CLK1 of a gate-on voltage (e.g., low voltage) is supplied to the second input terminal 102 at a first time point t1. Therefore, the sixth and eighth transistors M6 and M8 are turned on.

When the sixth transistor M6 is turned on, the first input terminal 101 and the first node N1 are connected to each other. At this time, since the third transistor M3 maintains a turn-on state by the voltage of the second power supply VSS, the first input terminal 101 is also connected to the third node N3 via the first node N1 and the third transistor M3. The start pulse SSP is not supplied to the first input terminal 101 at the first time point t1. That is, a gate-on voltage may be applied to the first input terminal 101, and thus a gate-on voltage, for example, a low voltage of the second power supply VSS may be supplied to the first and third nodes N1 and N3.

When a gate-on voltage is supplied to the first and third nodes N1 and N3, the seventh transistor M7, the fifth transistor M5, and the twelfth transistor M12 are turned on.

When the twelfth transistor M12 is turned on, the voltage of the first power supply VDD is supplied to the fourth node N4, and thus the fourth transistor M4 is turned off. At this time, the third capacitor C3 is charged with a voltage corresponding to the turn-off of the fourth transistor M4.

When the fifth transistor M5 is turned on, a voltage of the second power supply VSS is supplied to the output terminal 104. Accordingly, a voltage (i.e., gate-on voltage) of the second power supply VSS is output at the first emission control line E1.

When seventh transistor M7 is turned on, the first clock signal CLK1 is supplied to the second node N2. Here, since the ninth transistor M9 maintains a turn-on state, the first clock signal CLK1 is also supplied to the fifth node N5 via the second node N2.

On the other hand, when the eighth transistor M8 is turned on, a voltage of the second power supply VSS is supplied to the second and fifth nodes N2 and N5. Here, a voltage of the first clock signal CLK1 from the first time t1 to the second time t2 is set as a gate-on voltage, for example, the voltage of the second power supply VSS. Accordingly, voltages of the second and fifth nodes N2 and N5 are stably set to the voltage of the second power supply VSS.

When the voltages of the second and fifth nodes N2 and N5 are set to the voltage of the second power supply VSS, the first and eleventh transistors M1 and M11 are turned on.

When the eleventh transistor M11 is turned on, the second clock signal CLK2 supplied from the third input terminal 103 is supplied to the sixth node N6. The voltage of the second clock signal CLK2 from the first time point t1 to the third time point t3 is set to a gate-off voltage, for example, the voltage of the first power source VDD. Thus, since the tenth transistor M10 is set to the turn-off state, the fourth node N4 maintains the voltage of the first power supply VDD regardless of the voltages of the fifth and sixth nodes N5 and N6.

When the first transistor M1 is turned on, the voltage of the first power supply VDD is supplied to the second transistor M2. At this time, the second transistor M2 is set to the turn-off state by the gate-off voltage of the second clock signal CLK2, and thus the third node N3 maintains a low voltage.

At the second time point t2, the voltage of the first clock signal CLK1 is changed to a gate-off voltage, for example, a high voltage. Therefore, the sixth and eighth transistors M6 and M8 are turned off. At this time, the third and fourth nodes N3 and N4 maintain a voltage of the previous period by the first and third capacitors C1 and C3.

When the third transistor M3 maintains the turn-on state and the third node N3 maintains the low voltage, the voltage of the first node N1 is also maintained at the low voltage. Therefore, the seventh transistor M7, the fifth transistor M5, and the twelfth transistor M12 maintain the turn-on state.

When seventh transistor M7 is turned on, a high voltage of the first clock signal CLK1 is supplied to the second and fifth nodes N2 and N5. Then, the first and eleventh transistors M1 and M11 are turned off.

When the twelfth transistor M12 is turned on, the voltage of the fourth node N4 is maintained at a high voltage of the first power supply VDD. Thus, the fourth transistor M4 maintains the turn-off state.

When the fifth transistor M5 is turned on, the low voltage of the second power supply VSS is delivered to the output terminal 104. Therefore, the voltage of the first emission control line E1 is maintained at a low voltage.

At the third time point t3, the voltage of the second clock signal CLK2 is changed to a gate-on voltage, for example, a low voltage. Therefore, the second and tenth transistors M2 and M10 are turned on.

When tenth transistor M10 is turned on, the sixth node N6 is connected to the fourth node N4. At this time, the voltage of the fourth node N4 is maintained at the high voltage of the first power supply VDD.

When the second transistor M2 is turned on, the second electrode (e.g., drain electrode) of the first transistor M1 is connected to the third node N3. At this time, since the first transistor M1 is set to a turn-off state, the voltage of the first power supply VDD is not supplied to the first and third nodes N1 and N3.

In addition, when the voltage of the second clock signal CLK2 is changed to a low voltage, the voltage of the third node N3 is lowered to a voltage lower than the voltage of the second power supply VSS by the coupling action of the first capacitor C1. That is, when the second clock signal CLK2 is supplied as the low voltage, the third node N3 has a voltage lower than the voltage of the second power supply VSS as shown in FIG. 5. Then, a voltage applied to a gate electrode of the fifth transistor M5 is lowered to a voltage lower than the voltage of the second power supply VSS, thereby improving the driving characteristic of the fifth transistor M5.

On the other hand, the first node N1 substantially maintains voltage of the second power supply VSS regardless of the voltage drop of the third node N3 by the third transistor M3. That is, since the voltage of the second power supply VSS is applied to the gate electrode of the third transistor M3, the voltage of the first node N1 is substantially maintained at the voltage of the second power supply VSS regardless of the voltage drop of the third node N3. In this case, the voltage difference between the source and drain electrodes of the sixth transistor M6 is minimized to prevent the electrical characteristics of the sixth transistor M6 from being changed.

At the fourth time point t4, a gate-off voltage, for example, a start pulse SSP of a high voltage, begins to be supplied. At the fourth time point t4, the voltage of the first clock signal CLK1 is changed to a gate-on voltage, for example, a low voltage. Therefore, the sixth and eighth transistors M6 and M8 are turned on.

When the sixth transistor M6 is turned on, the first input terminal 101 is connected to the first and third nodes N1 and N3. Accordingly, a high voltage of the start pulse SSP is supplied to the first and third nodes N1 and N3, thereby both of the first and third nodes N1 and N3 have the same high voltage level as shown in FIG. 5. When the voltages of the first and third nodes N1 and N3 are set to a high voltage, the seventh transistor M7, the fifth transistor M5, and the twelfth transistor M12 are turned off.

When the eighth transistor M8 is turned on, the voltage of the second power supply VSS is supplied to the second and fifth nodes N2 and N5. Therefore, the first and eleventh transistors M1 and M11 are turned on.

At this time, even if the first transistor M1 is turned on, the voltage of the third node N3 does not change since the second transistor M2 is at the turn-off state.

When the eleventh transistor M11 is turned on, the sixth node N6 is connected to the third input terminal 103. At this time, since the tenth transistor M10 is set to the turn-off state, the voltage of the fourth node N4 is maintained at a high voltage.

At the fifth point of time t5, the voltage of the second clock signal CLK2 is changed to a gate-on voltage, for example, a low voltage. Therefore, the second and tenth transistors M2 and M10 are turned on. In addition, at the fifth point of time t5, the voltage of the second and fifth nodes N2 and N5 is set to a low voltage of the second power supply VSS, so that the first and eleventh transistors M1 and M11 maintain the turn-on state.

When the tenth and eleventh transistors M10 and M11 are turned on, a low voltage of the second clock signal CLK2 is supplied to the fourth node N4. Thus, the fourth node N4 has the low voltage level as shown in FIG. 5 such that the fourth transistor M4 is turned on. When the fourth transistor M4 is turned on, the voltage of the first power supply VDD is supplied to the output terminal 104. The voltage of the first power supply VDD supplied to the output terminal 104 is supplied to the first emission control line E1 as the first emission control signal.

When the first and second transistors M1 and M2 are turned on, the voltage of the first power supply VDD is supplied to the first and third nodes N1 and N3. As a result, the fifth and seventh transistors M5 and M7 stably maintain a turn-off state.

On the other hand, when the low voltage of the second clock signal CLK2 is supplied to the sixth node N6, the voltage of the fifth node N5 is lowered to a voltage lower than the voltage of the second power supply VSS by a coupling action of the second capacitor C2. That is, when the second clock signal CLK2 is supplied as the low voltage, the sixth node N6 has a voltage lower than the voltage of the second power supply VSS. Then, a voltage applied to a gate electrode of the eleventh transistor M11 is lowered to a voltage lower than the voltage of the second power supply VSS, thereby improving a driving characteristic of the eleventh transistor M11.

In addition, the voltage of the second node N2 substantially maintains the voltage of the second power supply VSS regardless of the voltage of the fifth node N5 by the ninth transistor M9. In other words, since the low voltage of the second power supply VSS is applied to a gate electrode of the ninth transistor M9, the second node N2 substantially maintains the voltage of the second power supply VSS regardless of a voltage drop of the fifth node N5. In this case, the voltage difference between the source and drain electrodes of seventh transistor M7 may be minimized to prevent the electrical characteristics of seventh transistor M7 from being changed. In addition, the voltage difference between the gate electrode and the source or drain electrode of the first transistor M1 may be minimized to prevent the electrical characteristics of the first transistor M1 from being changed.

At the sixth time point t6, the voltage of the first clock signal CLK1 is changed to a low voltage. Therefore, the sixth and eighth transistors M6 and M8 are turned on. At the sixth time point t6, a supply of the start pulse SSP is stopped and a low voltage may be applied to the first input terminal 101.

When the sixth transistor M6 is turned on, the first and third nodes N1 and N3 are connected to the first input terminal 101. Accordingly, the low voltage is supplied from the first input terminal 101 to the first and third nodes N1 and N3. When the first and third nodes N1 and N3 are set to a low voltage, the seventh transistor M7, the fifth transistor M5, and the twelfth transistor M12 are turned on.

When the seventh transistor M7 is turned on, the voltage of the first clock signal CLK1 is transferred to the second and fifth nodes N2 and N5.

When the twelfth transistor M12 is turned on, the voltage of the first power supply VDD is supplied to the fourth node N4. As a result, the fourth transistor M4 is turned off.

When the fifth transistor M5 is turned on, the voltage of the second power supply VSS is supplied to the output terminal 104. The voltage of the second power supply VSS supplied to the output terminal 104 is supplied to the first emission control line E1. Accordingly, the pixels PXL connected to the first emission control line E1 are set to an emission state.

The second stage ST2, which receives the first emission control signal from the output terminal 104 of the first stage ST1, may also supply the second emission control signal to the second emission scan line E2 while repeating the process described above. That is, the stages ST of the emission control driver 30 according to an exemplary embodiment may sequentially supply the emission control signals to the emission control lines E1 to En while repeating the process described above.

Each of emission control signals may have a width corresponding to the width of the start pulse SSP. For example, when the start pulse SSP is supplied to have a width corresponding to four horizontal periods 4H, the emission control signals having a width corresponding to three horizontal periods 3H may be output to the emission control lines E1 to En in such a manner that the emission control signals are sequentially shifted by one horizontal period 1H.

Therefore, the width of the emission control signal may be controlled by controlling the width of the start pulse SSP. Then, the emission period of the pixels PXL may be controlled by controlling the width of the emission control signal.

Figure 6:
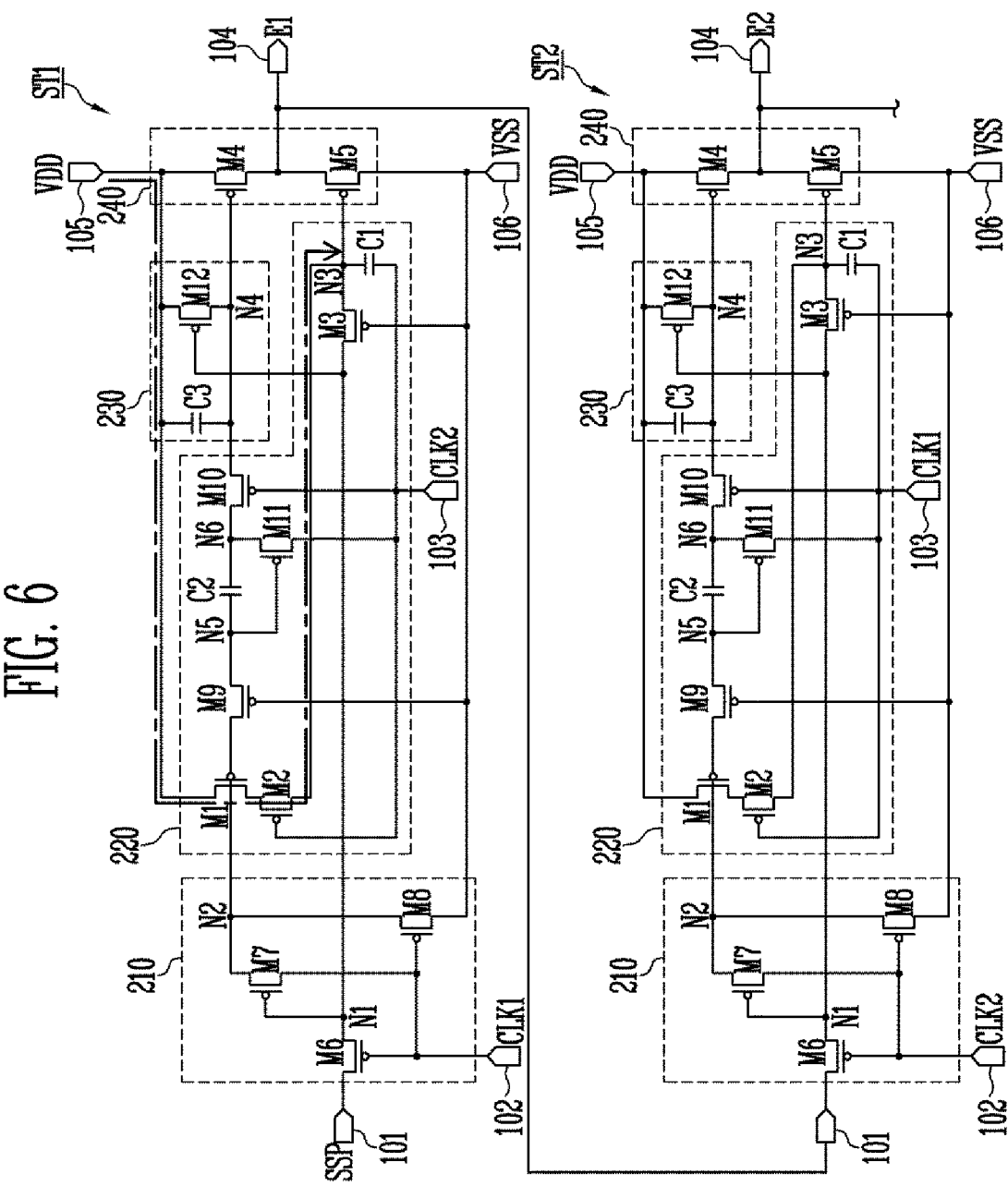
FIG. 6 is a block diagram illustrating a refreshing path of the first stage shown in FIG. 4.

FIG. 6 is a block diagram illustrating a refreshing path of the first stage shown in FIG. 4. For convenience of description, FIG. 6 shows a refreshing process of the first stage ST1, and the other stages ST may also be refreshed in substantially the same manner.

Referring to FIG. 6, the first transistor M5 may be maintained in a turn-off state by supplying a gate-off voltage to the third node N3 at the beginning the driving of the display device 1. For example, at the beginning of the driving the display device 1, the start pulse SSP of a high voltage may be continuously supplied during a predetermined time. Accordingly, it is possible to prevent the pixels PXL from unintentionally emitting light before each emission period by stably supplying an emission control signal of a gate-off voltage to the pixels PXL.

Specifically, in an exemplary embodiment, one electrode of the second transistor M2 is directly connected to the third node N3. Therefore, a refreshing path may be formed, the refreshing path being connected from the first power supply VDD to the third node N3 via the first and second transistors M1 and M2 without passing through the third transistor M3, which may serve as a resistance element.

At the beginning of the driving of the display device 1 set to the period before a substantial driving of the pixels PXL starts, the start pulse SSP with a gate-off voltage (e.g., high voltage) is applied to the first input terminal 101 of the first stage ST1, and the first and second clock signals CLK1 and CLK2 with a gate-on voltage (e.g., low voltage) are alternately supplied to the second and third input terminals 102 and 103 of the first stage ST1.

When the first clock signal CLK1 of the low voltage is supplied to the second input terminal 102, the sixth and eighth transistors M6 and M8 are turned on. When the sixth transistor M6 is turned on, the high voltage of the start pulse SSP is supplied to the first node N1. As a result, the seventh and twelfth transistors M7 and M12 are turned off. On the other hand, the high voltage of the start pulse SSP is also transferred to the third node N3 after a passage of a little time via the third transistor M3, so that the fifth transistor M5 may maintain the turn-off state.

When the eighth transistor M8 is turned on, the voltage of the second power supply VSS is supplied to the second node N2. Therefore, the first transistor M1 is turned on.

When the second clock signal CLK2 of a low voltage is supplied from the third input terminal 103 after half a cycle (e.g., one horizontal period 1H) of the first and second clock signals CLK1 and CLK2, the second transistor M2 is turned on. Accordingly, a high voltage of the first power supply VDD is quickly transferred to the third node N3 while a refreshing path is formed from the first power supply VDD to the third node N3 via the first and second transistors M1 and M2. In addition, a high voltage of the first power supply VDD may be transferred to the third node N3 of the other stages ST in the same method.

According to an exemplary embodiment described above, the speed of t refreshing he stages ST may be improved by setting the refreshing path not to pass through a circuit element capable of generating a delay such as the third transistor M3. Accordingly, even at the beginning of the driving of the display device 1 in which node voltages inside the stages ST are unstable, a gate-off voltage is quickly transferred to the third node N3 so that the voltage of the second power source VSS may be prevented from being supplied to the emission control lines E. Therefore, according to an exemplary embodiment, it is possible to improve the output quality of the emission control driver 30 and to prevent a flashing due to the emission of pixels PXL unintended.

On the other hand, when one electrode of the second transistor M2 is connected to the third node N3 via the third transistor M3, a delay caused by the third transistor M3 may delay the transfer of the gate-off voltage to the third node N3. At this time, since the voltage of the first and second clock signals CLK1 and CLK2 is toggled at high speed, the fifth transistor M5 may be turned on while the voltage of the third node N3 is lowered by a coupling action of the first capacitor C1 when the voltage of the third node N3 is not yet stabilized and the second clock signal CLK2 of the gate-on voltage is supplied to the third input terminal 103. Therefore, the voltage of the second power supply VSS rises while the emission control lines E are connected to the second power supply VSS, and the turn-on time of the third transistor M3 may be further delayed. That is, when the refreshing path is formed to pass through the third transistor M3, the time when the voltage of the first power supply VDD is transferred to the third node N3 is delayed, and an abnormal emission such as a flashing in which the pixels PXL emit light at the same time may occur. On the other hand, in an exemplary embodiment, the second transistor M2 may be directly connected to the third node N3 to prevent abnormal emission of the pixels PXL.

Figure 7:
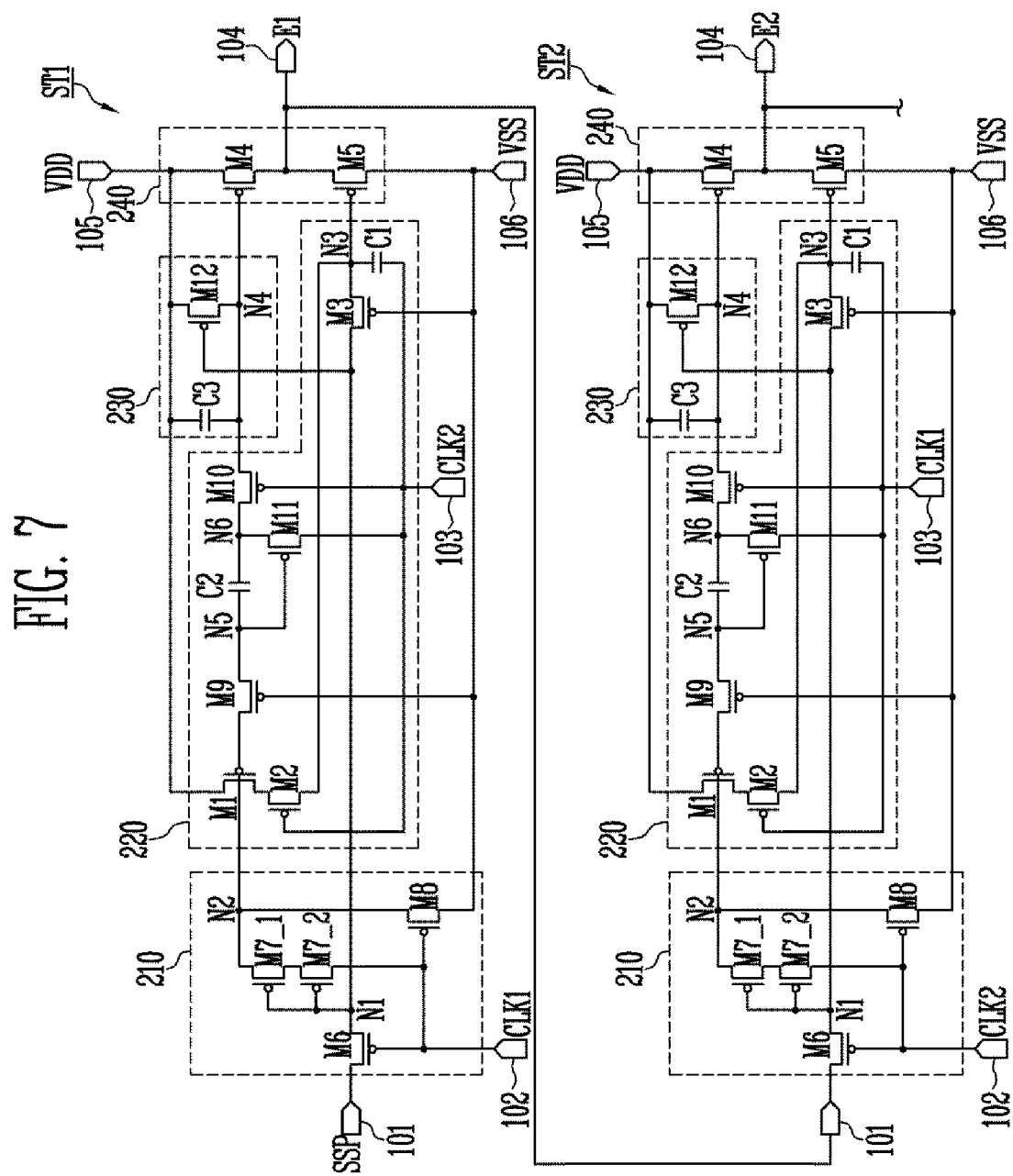
FIG. 7 is a circuit diagram of a second exemplary embodiment of two stages shown in FIG. 3.
Figure 8:
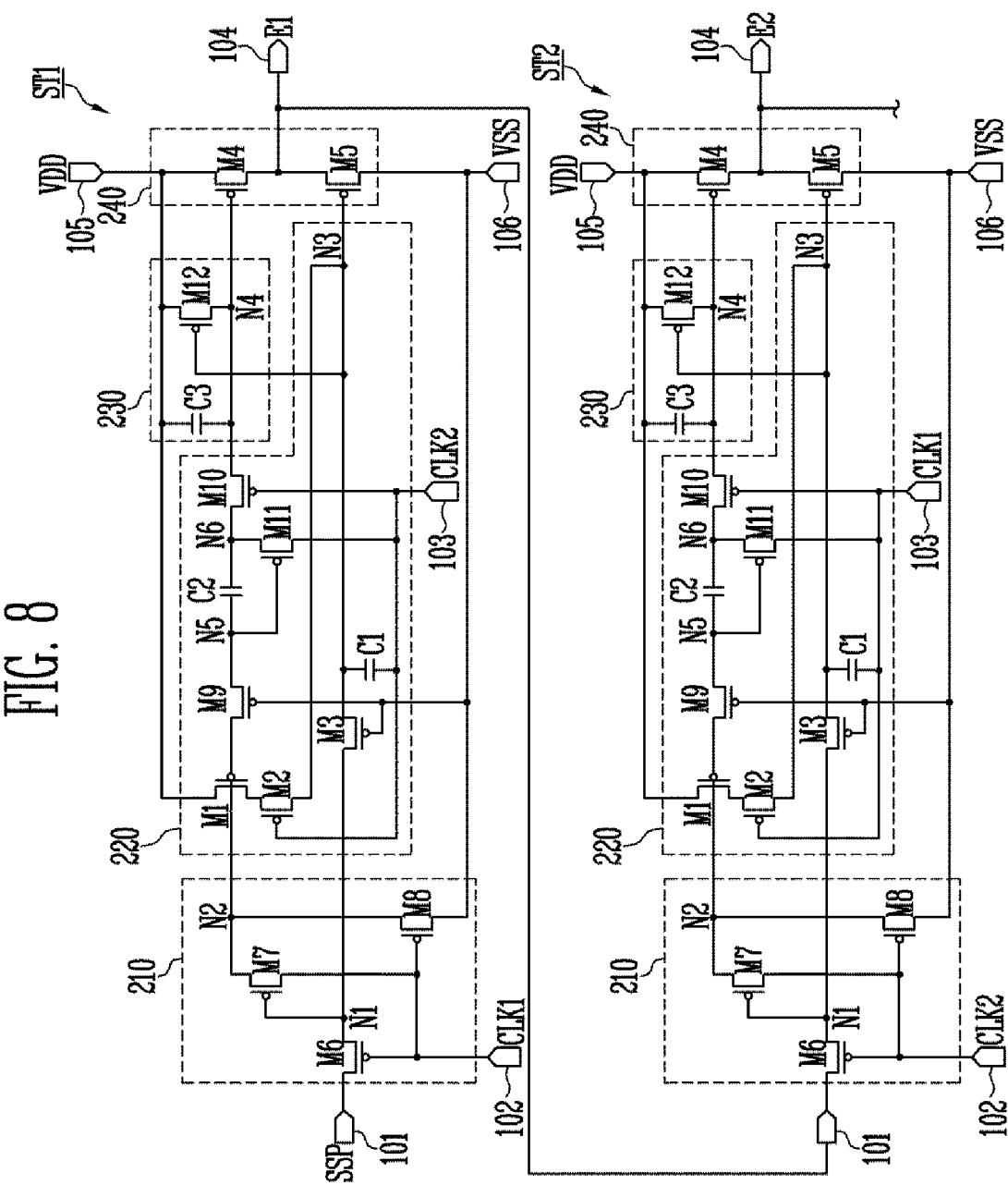
FIG. 8 is a circuit diagram of a third exemplary embodiment of two stages shown in FIG. 3.

FIG. 7 is a circuit diagram of a second exemplary embodiment of two stages shown in FIG. 3, and FIG. 8 is a circuit diagram of a third exemplary embodiment of two stages shown in FIG. 3. For example, FIGS. 7 and 8 show another exemplary embodiment of the stage ST shown in FIG. 4. When describing exemplary embodiments of FIGS. 7 and 8, the same or similar components as those of the exemplary embodiment described above (e.g., exemplary embodiment of FIG. 4) are denoted by the same reference numerals, and a detailed description thereof will be omitted to avoid redundancy.

Referring to FIG. 7, at least one transistor forming each stage ST may be formed of a transistor of a dual structure. For example, the seventh transistor may be provide as a plurality of seventh transistors M7_1 and M7_2 connected in series between the second node N2 and the second input terminal 102. Gate electrodes of the seventh transistors M7_1 and M7_2 are commonly connected to the first node N1.

In the exemplary embodiment described above, a plurality of seventh transistors M7_1 and M7_2 are formed to minimize the leakage current, and the remaining configuration except for the seventh transistors M7_1 and M7_2 is substantially the same as an exemplary embodiment of FIG. 4. In addition, the operation of the stage ST by exemplary embodiments of FIGS. 4 and 7 may be substantially the same as each other.

Referring to FIG. 8, the position and/or connecting structure of at least one transistor forming each stage ST may be changed. For example, the stages ST are formed so that the gate electrode of the twelfth transistor M12 may be directly connected to the third node N3 without passing through the third transistor M3. In this case, the twelfth transistor M12 is turned on or off in response to the voltage of the third node N3, and the remaining configuration and operation except therefor may be substantially the same as the exemplary embodiment of FIG. 4.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A stage in an emission control driver of a display device, the stage comprising:
an input unit connected to a first node, a second node, a first input terminal and a second input terminal to control a voltage of the first node and the second node in response to a first input signal supplied from the first input terminal and a second input signal supplied from the second input terminal, respectively;

a first controller connected to the second node, a third node, a fourth node and a third input terminal to control a voltage of the third node and the fourth node in response to a third input signal supplied from the third input terminal and the voltage of the second node;

a second controller connected to the first node and the fourth node to control the voltage of the fourth node in response to the voltage of the first node; and an output unit connected to the third node, the fourth node, a first power supply, a second power supply, and an output terminal to supply a voltage of the first power supply or the second power supply to the output terminal in response to the voltage of the third node or the voltage of the fourth node, wherein the first controller comprises:

a first transistor and a second transistor connected between the first power supply and the third node; and a third transistor connected between the first node and the third node, the third transistor being turned on in response to the voltage of the second power supply.

2. The stage of claim 1, wherein the second transistor has one electrode connected directly to the third node without passing through the third transistor.

3. The stage of claim 1, wherein the first transistor has a gate electrode connected to the second node, and the second transistor has a gate electrode connected to the third input terminal.

4. The stage of claim 1, wherein the first controller further comprises a first capacitor connected between the third node and the third input terminal.

5. The stage of claim 4, wherein the voltage of the first power supply is set to a gate-off voltage, and the voltage of the second power supply is set to a gate-on voltage.

6. The stage of claim 5, wherein the output unit comprises a fourth transistor connected between the first power supply and the output terminal the fourth transistor having a gate electrode connected to the fourth node; and a fifth transistor connected between the output terminal and the second power supply, the fifth transistor having a gate electrode connected to the third node.

7. The stage of claim 6, wherein the first input signal is a start pulse or an output signal of a previous stage, and the second input signal is a first clock signal and the third input signal is a second clock signal.

8. The stage of claim 7, wherein the first clock signal and the second clock signal alternately have a gate-on voltage, and the start pulse or the output signal of the previous stage is supplied to overlap with at least one gate-on voltage period of the first clock signal.

9. The stage of claim 7, wherein the input unit comprises a sixth transistor connected between the first input terminal and the first node, the sixth transistor having a gate electrode connected to the second input terminal;

a seventh transistor connected between the second node and the second input terminal, the seventh transistor having a gate electrode connected to the first node; and an eighth transistor connected between the second node and the second power supply, the eight transistor having a gate electrode connected to the second input terminal.

10. The stage of claim 9, wherein the first controller further comprises a ninth transistor connected between the second node and a fifth node, the ninth transistor being turned on in response to a voltage of the second power supply;

a second capacitor connected between the fifth node and a sixth node;

a tenth transistor connected between the fourth node and the sixth node, the tenth transistor having gate electrode connected to the third input terminal; and an eleventh transistor connected between the sixth node and the third input terminal, the eleventh transistor having a gate electrode connected to the fifth node.

11. The stage of claim 10, wherein the second controller comprises a twelfth transistor connected between the first power supply and the fourth node, the twelfth transistor having a gate electrode connected to the first node or the third node; and a third capacitor connected between the first power supply and the fourth node.

12. A display device comprising:

a plurality of pixels connected to a plurality of scan lines, a plurality of data lines, and a plurality of emission control lines;

a scan driver to supply scan signals to the scan lines;

a data driver to supply data signals to the data lines; and an emission control driver having a plurality of stages to supply emission control signals to the emission control lines, wherein each of the stages comprises, an input unit connected to a first node, a second node, a first input terminal and a second input terminal to control a voltage of the first node and the second node in response to a first input signal supplied from the first input terminal and a second input signal supplied from the second input terminal, respectively;

a first controller connected to the first node, the second node, a third node, a fourth node, a third input terminal, a first power supply and a second power supply to control a voltage of the third node and the fourth node in response to a third input signal supplied from the third input terminal and the voltage of the second node, and including a first transistor and a second transistor connected between the first power supply and the third node, and a third transistor connected between the first node and the third node, the third transistor being turned on in response to the voltage of the second power supply;

a second controller connected to the first node and the fourth node to control a voltage of the fourth node in response to a voltage of the first node; and an output unit connected to the third node, the fourth node, the first power supply, the second power supply, and an output terminal to supply a voltage of the first power supply or the second power supply to the output terminal in response to a voltage of the third node or the voltage of the fourth node.

13. The display device of claim 12, wherein the second transistor has one electrode connected directly to the third node without passing through the third transistor.

14. The display device of claim 12, wherein the first transistor has a gate electrode connected to the second node, and
the second transistor has a gate electrode connected to the third input terminal.

15. The display device of claim 12, wherein
the first controller further comprises a first capacitor connected between the third input terminal and the third node.

16. The display device of claim 12, wherein
the voltage of the first power supply is set to a gate-off voltage, and
the voltage of the second power supply is set to a gate-on voltage.

17. The display device of claim 16, wherein
the output unit comprises
a fourth transistor connected between the first power supply and the output terminal, the fourth transistor having a gate electrode connected to the fourth node; and
a fifth transistor connected between the output terminal and the second power supply, the fifth transistor having a gate electrode connected to the third node.

18. The display device of claim 12, wherein
the stages include a first stage to receive a start pulse through the first input terminal and the other stages to receive an output signal of a previous stage through the first input terminal.

19. The display device of claim 12, wherein the stages include odd numbered stages to receive a first clock signal through the second input terminal and a second clock signal through the third input terminal, respectively, and
even numbered stages to receive the second clock signal through the second input terminal and the first clock signal through the third input terminal, respectively.

20. The display device of claim 19, wherein
the first clock signal and the second clock signal alternately have a gate-on voltage.

* * * * *